(12) United States Patent  
Kim

(10) Patent No.: US 7,951,661 B2
(45) Date of Patent: May 31, 2011

(54) SEMICONDUCTOR DEVICE AND METHOD OF FABRICATING THE SAME

(75) Inventor: Hee Sang Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 652 days.

(21) Appl. No.: 11/966,406

(22) Filed: Dec. 28, 2007

(65) Prior Publication Data

US 2009/0101991 A1    Apr. 23, 2009

(30) Foreign Application Priority Data

Oct. 17, 2007    (KR) .................. 10-2007-0104699

(51) Int. Cl.
*H01L 21/336* (2006.01)
*H01L 21/8234* (2006.01)
*H01L 21/8242* (2006.01)

(52) U.S. Cl. ........ 438/197; 438/248; 438/258; 438/270; 438/274; 438/426; 257/E21.419; 257/E21.428; 257/E21.429

(58) Field of Classification Search ........... 257/E21.419, 257/E21.428, E21.429
See application file for complete search history.

(56) References Cited

U.S. PATENT DOCUMENTS

| | | | | |
|---|---|---|---|---|
| 5,441,915 A * | 8/1995 | Lee | | 438/631 |
| 5,828,120 A * | 10/1998 | Ishikawa | | 257/499 |
| 6,717,267 B1 * | 4/2004 | Kunikiyo | | 257/758 |
| 7,365,390 B2 * | 4/2008 | Kim | | 257/327 |
| 7,531,414 B2 * | 5/2009 | Park et al. | | 438/270 |
| 7,534,726 B2 * | 5/2009 | Park et al. | | 438/700 |
| 7,709,324 B2 * | 5/2010 | Shiratake | | 438/259 |
| 2007/0173005 A1 * | 7/2007 | Lee | | 438/197 |
| 2008/0042226 A1 * | 2/2008 | Nagai | | 257/417 |
| 2008/0150014 A1 * | 6/2008 | Hwang et al. | | 257/330 |
| 2008/0224230 A1 * | 9/2008 | Lee | | 257/382 |
| 2008/0251839 A1 * | 10/2008 | Lee | | 257/331 |
| 2008/0290390 A1 * | 11/2008 | Cha | | 257/306 |
| 2008/0290391 A1 * | 11/2008 | Hsu et al. | | 257/315 |

FOREIGN PATENT DOCUMENTS

| | | |
|---|---|---|
| JP | 2000-058844 | 2/2000 |
| KR | 1020020081819 A | 10/2002 |
| KR | 1020050094118 A | 9/2005 |
| KR | 1020050115683 A | 12/2005 |
| KR | 1020070018280 A | 2/2007 |
| WO | WO 2007/002117 A2 | 1/2007 |

* cited by examiner

*Primary Examiner* — Charles Garber
*Assistant Examiner* — Mohsen Ahmadi
(74) *Attorney, Agent, or Firm* — Kilpatrick Townsend & Stockton LLP

(57) ABSTRACT

A semiconductor device includes a device isolation structure having a grounded conductive layer to define an active region, and a gate formed over the active region and the device isolation structure.

18 Claims, 5 Drawing Sheets

(i)

(ii)

SEMICONDUCTOR DEVICE AND METHOD OF FABRICATING THE SAME

CROSS-REFERENCES TO RELATED APPLICATIONS

The priority of Korean patent application number 10-2007-0104699, filed on Oct. 17, 2007, which is incorporated by reference in its entirety, is claimed.

BACKGROUND OF THE INVENTION

The present invention relates to a semiconductor device. More particularly, the present invention relates to a semiconductor device including a recess transistor and a method of fabricating the same.

As a semiconductor device becomes smaller and more highly integrated, a technology for reducing the size of a semiconductor device has been required. Due to the trends in miniaturization and integration of semiconductor devices, the design rule for the semiconductor device is reduced so that a channel length of a metal oxide semiconductor field effect transistor (MOSFET) is decreased.

Since the reduced channel length decreases a distance between a source region and a drain region, there is a difficulty in controlling a short channel effect (SCE), e.g., a voltage of the drain region affects voltages of the source region and the channel region. As a result, active switch elements are degraded. The narrow gap between the source region and the drain region causes a punch-through phenomenon between a source region and a drain region. In order to prevent the punch-through phenomenon, the gate can be formed by recessing the semiconductor substrate and filling it with a gate electrode, thereby increasing an effective channel length. This structure is called a recess field effect transistor (FET) structure. The recess FET structure reduces the punch-through phenomenon by increasing the effective channel length.

However, the recess FET structure is weak in controlling degradation of a threshold voltage Vt, thereby lowering a threshold voltage and generating a leakage current when the transistor is in an OFF state. Since the semiconductor substrate is etched at a relatively deep level to form the recess FET structure, the device characteristic such as a leakage current characteristic in the transistor OFF state is degraded by the passing gate effect as well as the neighboring gate effect.

SUMMARY OF THE INVENTION

Embodiments of the present invention are directed to a semiconductor device including a recess transistor. According to an embodiment of the present invention, the recess transistor includes a recess gate having a grounded conductive structure between adjacent cell gates. The semiconductor device minimizes interference between the adjacent cell gates, and prevents a coupling phenomenon between the adjacent cell gates.

According to an embodiment of the present invention, a semiconductor device includes a device isolation structure to define an active region, and a gate. The device isolation structure includes a grounded first conductive layer. The gate is formed over the active region and the device isolation structure.

According to an embodiment of the present invention, a method of fabricating a semiconductor device includes forming a device isolation structure including a first conductive layer over a semiconductor substrate to define an active region. The first conductive layer is grounded. A gate is formed over the active region and the device isolation structure.

DESCRIPTION OF EMBODIMENTS

Figure 1:
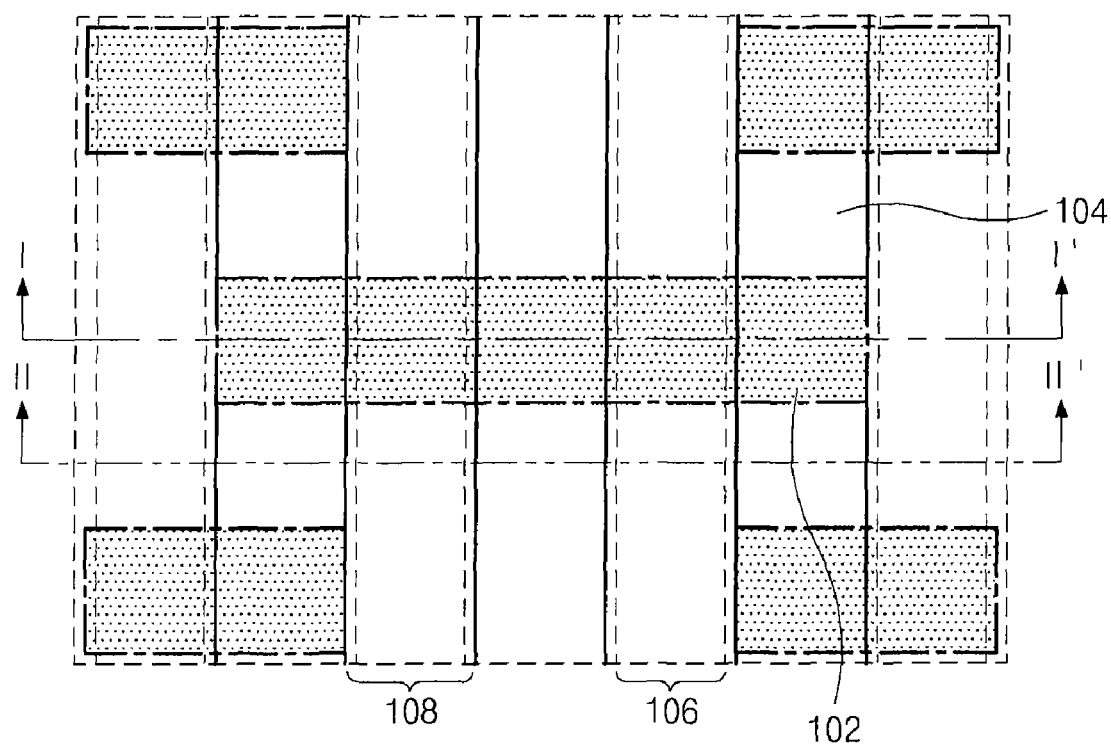
FIG. 1 is a layout of a semiconductor device according to an embodiment of the present invention.

FIG. 1 is a layout of a semiconductor device according to an embodiment of the present invention. A semiconductor device includes an active region 102, a device isolation region 104, a recess gate region 106 and a gate region 108. Active region 102 is defined by device isolation region 104. Gate region 108 overlaps active region 102 and adjacent device isolation region 104. Recess gate region 106 overlaps gate region 108, and disposed in gate region 108.

Figure 2:
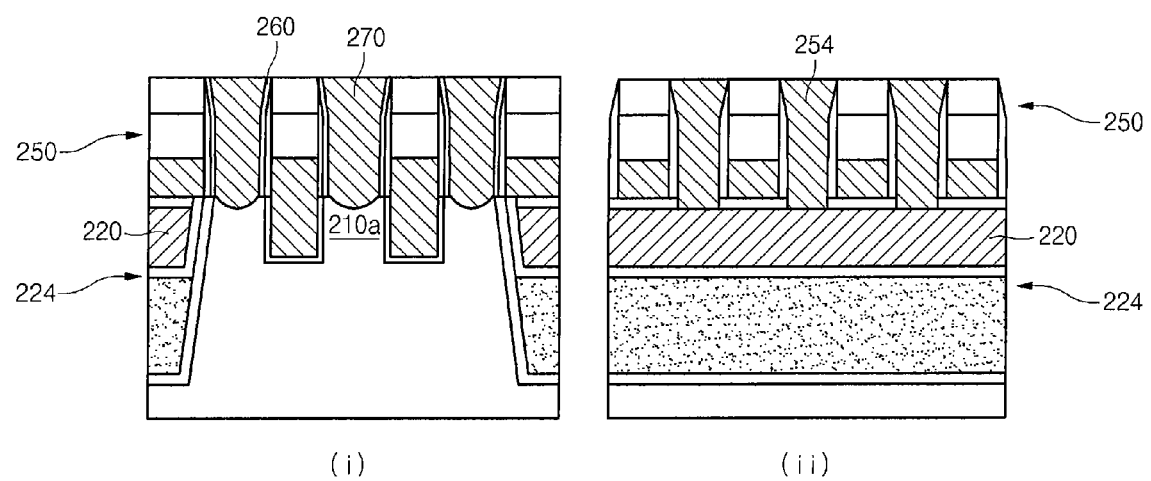
FIG. 2 is a cross-sectional view illustrating a semiconductor device according to an embodiment of the present invention.

FIG. 2 is a cross-sectional view of a semiconductor device according to an embodiment of the present invention. FIG. 2(i) is a cross-sectional view taken along I-I' of FIG. 1, and FIG. 2(ii) is a cross-sectional view taken along II-II' of FIG. 1. A semiconductor device includes a device isolation structure 224, a gate structure 250 and a landing plug 270. Device isolation structure 224 is formed lo over a semiconductor substrate 210 to define an active region 210a. Gate structure 250 includes a recess gate formed over active region 210a and device isolation structure 224. Landing plug 270 is filled with a conductive material between gate structures 250 over active region 210a.

Device isolation structure 224 includes (or encloses) a first conductive layer 220 so that gate structure 250 may not affect a neighboring gate effect and a passing gate effect by a fringing field. First conductive layer 220 is grounded to minimize the neighboring gate effect and the passing gate effect. A second conductive layer 254 is formed between gate structures 250. Second conductive layer 254 is electrically connected with first conductive layer 220 of device isolation structure 224, thereby shielding the neighboring gate effect. An insulating spacer 260 is formed at an interface between landing plug 270 and second conductive layer 254. Insulating spacer 260 can electrically isolate second conductive layer 254 from the landing plug 270.

Figure 3A:
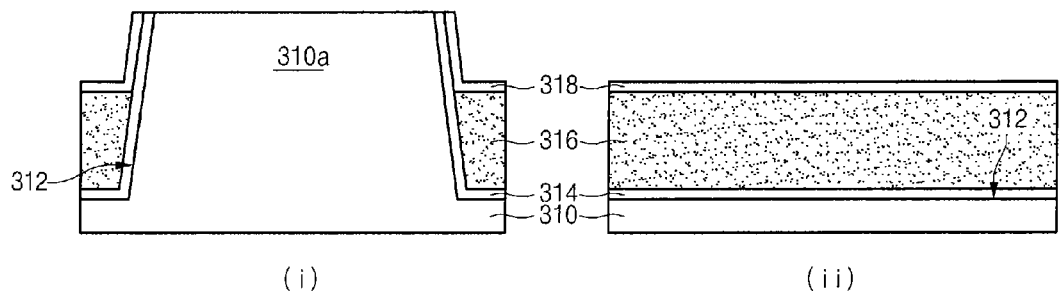
FIGS. 3a to 3f are cross-sectional views illustrating a method of fabricating a semiconductor device according to an embodiment of the present invention.

FIGS. 3a to 3f are cross-sectional views illustrating a method of fabricating a semiconductor device according to an embodiment of the present invention. FIG. 3a(i) to FIG. 3f(i) are cross-sectional views taken along I-I' of FIG. 1, and FIG. 3a(ii) to FIG. 3f(ii) are cross-sectional views taken along II-II' of FIG. 1. A portion of a semiconductor substrate 310 is etched with a mask (not shown) that defines active region 102 of FIG. 1 to form a trench for device isolation 312 that defines an active region 310a. A liner nitride film 314 is formed over trench 312. A first insulating film 316 is formed over active region 310a and liner nitride film 314. First insulating film 316 is selectively etched until active region 310a is exposed, thereby filling a portion of trench 312. A second insulating film 318 is formed over first insulating film 316 and liner nitride film 314.

First insulating film 316 includes a spin-on-dielectric (SOD) film having an excellent gap-fill characteristic. Second insulating film 318 includes a nitride film. First insulating film 316 is selectively etched by an etch-back method.

Figure 3B:
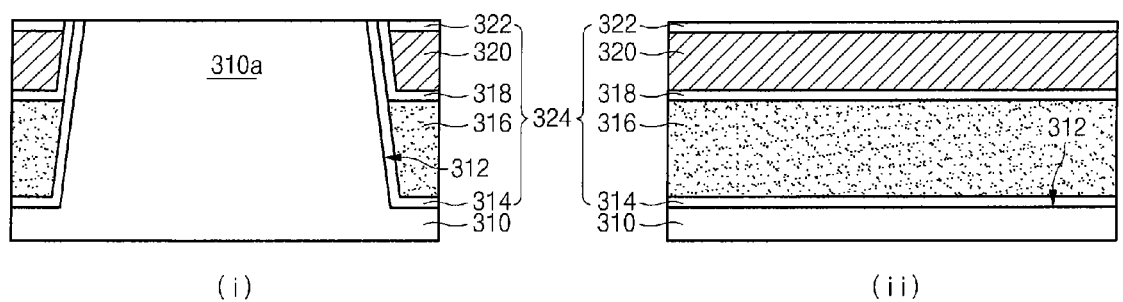

Referring to FIG. 3b, a first conductive layer 320 is formed over second insulating film 318 and active region 310a. First conductive layer 320 is selectively etched to expose active region 310a. First conductive layer 320 is selectively etched to lower the height of first conductive layer 320. A third insulating film 322 is formed over first conductive layer 320 and active region 310a. Third insulating film 322 is selectively etched to expose active region 310a to form a device isolation structure 324 including first conductive layer 320.

First conductive layer 320 includes a polysilicon layer. First conductive layer 320 is selectively etched by a chemical mechanical polishing (CMP) method or an etch-back method. Third insulating film 322 includes a SOD layer. Third insulating film 322 is selectively etched by a CMP method or an etch-back method.

Figure 3C:
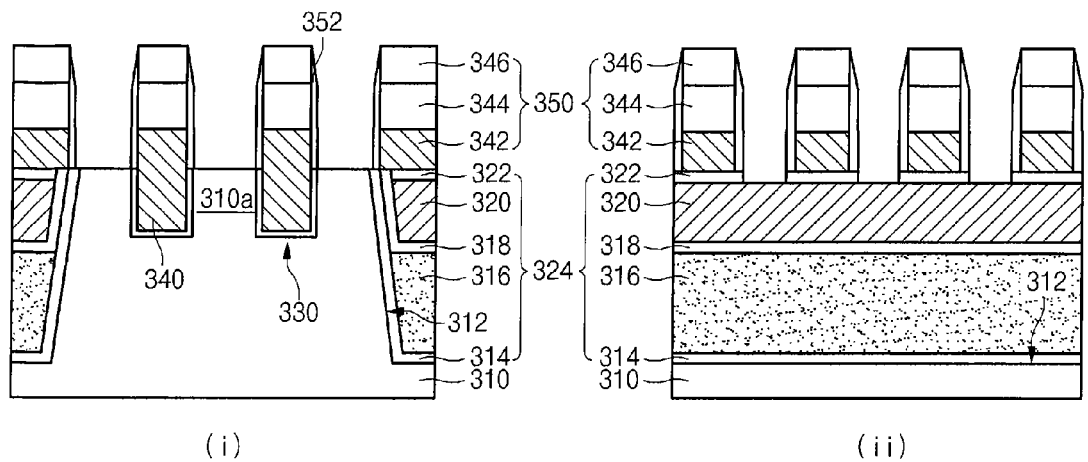

Referring to FIG. 3c, a portion of active region 310a is etched with a mask (not shown) that defines recess gate region 106 of FIG. 1 to form a recess 330. A gate insulating film 340 is formed over recess 330 and active region 310a. A lower gate conductive layer 342 is formed over gate insulating film 340 and device isolation structure 324 to fill recess 330. An upper gate conductive layer 344 and a gate hard mask layer 346 are formed over lower gate conductive layer 342.

Gate hard mask layer 346, upper gate conductive layer 344 and lower gate conductive layer 342 are patterned with a mask (not shown) that defines gate region 108 of FIG. 1 to form a gate structure 350. A fourth insulating film (not shown) is formed over gate structure 350. The fourth insulating film is selectively etched to form a gate spacer 352 over a sidewall of gate structure 350. Third insulating film 322 is selectively etched using gate structure 350 and gate spacer 352 as an etching mask to expose the first conductive layer 320 in device isolation structure 324.

Lower gate conductive layer 342 is used as a lower gate electrode. Upper gate conductive layer 344 is used as an upper gate electrode. Gate hard mask layer 346 and the fourth insulating film include a nitride film. The fourth insulating film is selectively etched by an etch-back method.

Figure 3D:
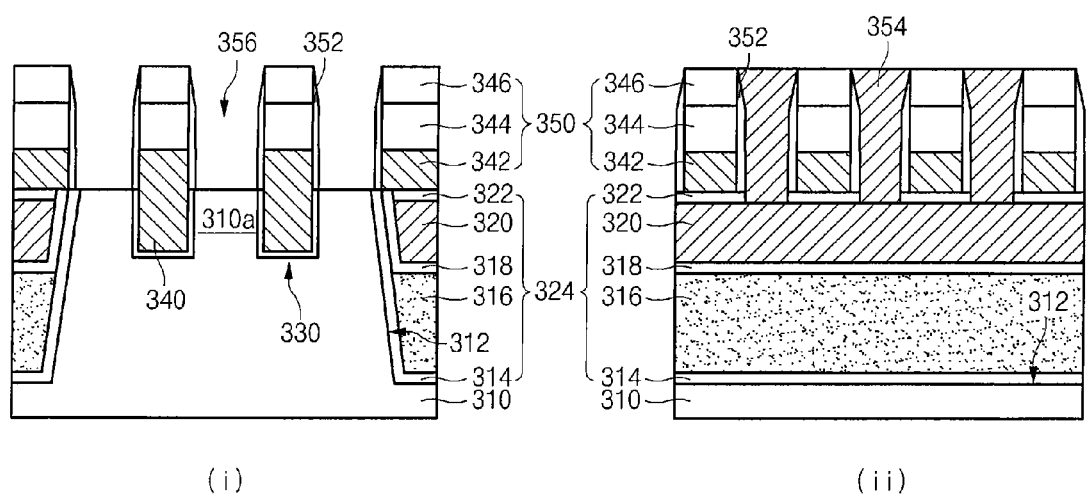
Figure 3E:
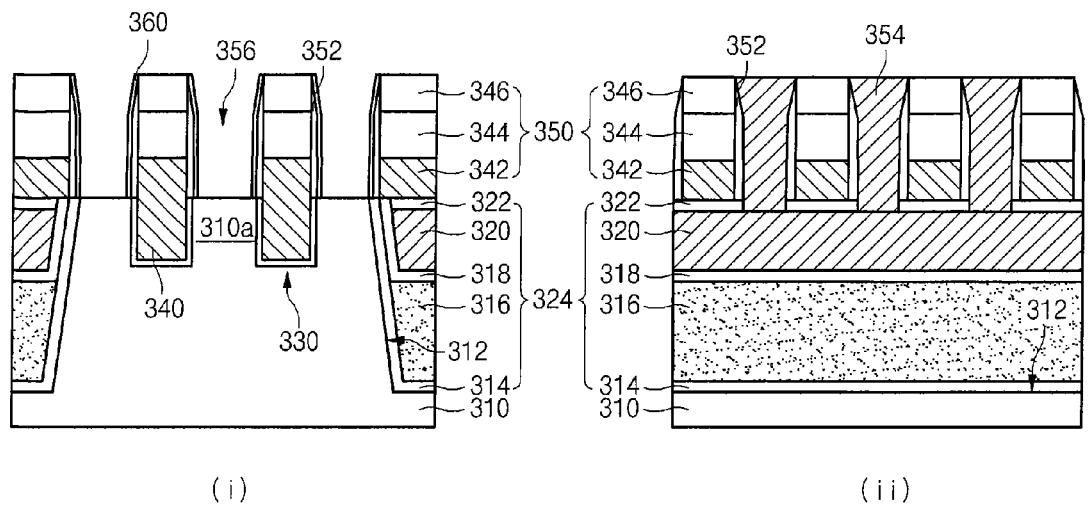
Figure 3F:
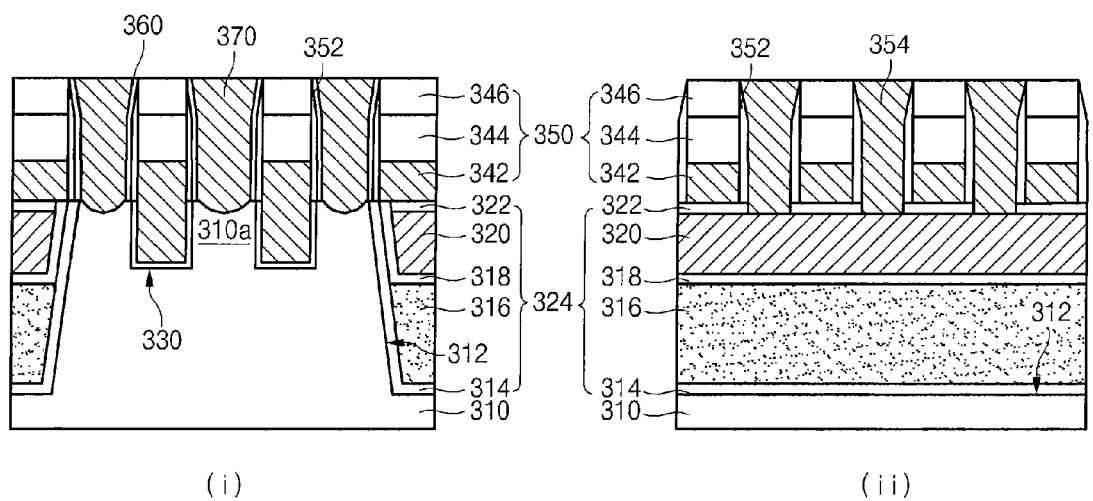

Referring to FIGS. 3d to 3f, a fourth conductive layer 354 is formed over active region 310a, device isolation structure 324 and gate structure 350 to fill gate structure 350. fourth conductive layer 354 is electrically connected with first conductive layer 320 of device isolation structure 324. fourth conductive layer 354 includes a polysilicon layer. Fourth conductive layer 354 is planarized until gate hard mask layer 346 is exposed.

A portion of fourth conductive layer 354 is selectively etched using a landing plug contact mask (not shown) to form a landing plug contact hole 356 that exposes active region 310a. A fifth insulating film (not shown) is formed over fourth conductive layer 354 and gate structure 350 including gate spacer 352. The fifth insulating film is selectively etched to form a spacer 360 over a sidewall of landing plug contact hole 356. Spacer 360 electrically isolates fourth conductive layer 354, which defines landing plug contact hole 356, from a subsequent landing plug to be formed. The fifth insulating film includes an oxide film. The fifth insulating film is selectively etched by an etch-back method.

A fifth conductive layer (not shown) is formed over active region 310a, spacer 360, and fourth conductive layer 354 to fill landing plug contact hole 356. The fifth conductive layer is planarized until gate hard mask layer 346 is exposed, thereby obtaining a landing plug 370.

Subsequent processes may be performed with well know processes of forming a transistor to complete a recess transistor. When a bit line is formed, fourth conductive layer 354 may be grounded. As a result, a semiconductor device including a grounded conductive layer can minimize a neighboring gate effect or a passing gate effect.

As described above, a semiconductor device according to an embodiment of the present invention includes a device isolation structure including a grounded conductive layer to reduce a neighboring gate effect and a passing gate effect. In addition, the semiconductor device prevents a coupling phenomenon between neighboring gates.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a semiconductor substrate having a trench that defines an active region of the semiconductor substrate;
    a device isolation structure disposed within the trench, the device isolation structure having a stacked structure that includes a liner film contacting sidewalls of the trench, a first insulating film, a grounded first conductive layer formed over the first insulating film and separated from the sidewalls of the trench by at least the liner film, and a third insulating film formed over the first grounded conductive layer within the trench;
    a first gate formed over the active region; and
    a second gate formed over the third insulating film.

2. The semiconductor device of claim 1, wherein the first gate includes a recess.

3. The semiconductor device of claim 1, further comprising:
    an interlayer insulating film formed to fill between the first gate and the second gate; and
    a landing plug electrically connected with the active region between the first gate and the second gate.

4. The semiconductor device of claim 1, wherein the liner film comprises a nitride film.

5. The semiconductor device of claim 1, wherein the first insulating film comprises a spin-on-dielectric (SOD) film.

6. The semiconductor device of claim 1, wherein the first conductive layer comprises polysilicon.

7. The semiconductor device of claim 1, wherein the device isolation structure further comprises a second insulating film formed over the first insulating film and separating the grounded first conductive layer from the first insulating film.

8. The semiconductor device of claim 7, wherein the second insulating film comprises a nitride film.

9. A method for fabricating a semiconductor device, the method comprising:
    forming a trench in a semiconductor substrate, the trench defining an active region of the semiconductor substrate;
    forming a device isolation structure having a stacked structure that is disposed within the trench, the formation of the device isolation structure including:
        forming a liner film contacting sidewalls of the trench,
        forming a first insulating film within the trench,
        forming a first conductive layer within the trench and over the first insulating film, the first conductive layer being grounded and separated from the sidewalls of the trench by at least the liner film;

forming a third insulating film over the first conductive layer within the trench; and forming a first gate over the active region and a second gate over the third insulating film.

10. The method of claim 9, wherein the process of forming the first gate comprises:

etching a portion of the active region to form a recess;

forming a gate insulating film over the active region including the recess;

filling the recess with a gate conductive layer;

forming a gate hard mask layer over the gate conductive layer; and patterning the gate hard mask layer and the gate conductive layer to form the first gate.

11. The method of claim 9, further comprising:

forming an interlayer insulating film filling between the first gate and the second gate;

polishing the interlayer insulating film until the gate hard mask layer is exposed;

selectively etching a portion of the interlayer insulating film using a landing plug contact mask to form a landing plug contact hole exposing the active region; and forming a landing plug over the landing plug contact hole.

12. The method of claim 11, further comprising forming an insulating film at an interface of the landing plug and the interlayer insulating film.

13. The method of claim 9, further comprising etching the third insulating film to expose the active region.

14. The method of claim 9, wherein the liner film comprises a nitride film.

15. The method of claim 9, wherein the first insulating film comprises a spin-on-dielectric (SOD) film.

16. The method of claim 9, wherein the first conductive layer comprises polysilicon.

17. The method of claim 9, further comprising forming a second insulating film over the first insulating film to separate the grounded first conductive layer from the first insulating film.

18. The method of claim 17, wherein the second insulating film comprises a nitride film.

\* \* \* \* \*